(12) United States Patent
Mizukami et al.

(10) Patent No.: US 12,159,668 B2
(45) Date of Patent: Dec. 3, 2024

(54) MAGNETO-OPTICAL MEMORY INTERFACE

(71) Applicants: Tohoku University, Miyagi (JP); National Institutes for Quantum Science and Technology, Chiba (JP)

(72) Inventors: Shigemi Mizukami, Sendai (JP); Shunsuke Fukami, Sendai (JP); Junsaku Nitta, Sendai (JP); Satoshi Iihama, Sendai (JP); Yoshiro Hirayama, Sendai (JP); Seiji Sakai, Chiba (JP)

(73) Assignees: Tohoku University, Miyagi (JP); National Institutes for Quantum Science and Technology, Chiba (JP)

( * ) Notice: Subject to any disclaimer, the term of this patent is extended or adjusted under 35 U.S.C. 154(b) by 133 days.

(21) Appl. No.: 18/246,780

(22) PCT Filed: Sep. 30, 2020

(86) PCT No.: PCT/JP2020/037199
§ 371 (c)(1),
(2) Date: Mar. 27, 2023

(87) PCT Pub. No.: WO2022/070325
PCT Pub. Date: Apr. 7, 2022

(65) Prior Publication Data
US 2023/0368840 A1   Nov. 16, 2023

(51) Int. Cl.
*G11C 11/16* (2006.01)
*G11C 13/06* (2006.01)

(52) U.S. Cl.
CPC .............. *G11C 13/06* (2013.01); *G11C 11/16* (2013.01)

(58) Field of Classification Search
CPC ..................................................... G11C 11/16
See application file for complete search history.

(56) References Cited

U.S. PATENT DOCUMENTS

2019/0295616 A1 *   9/2019   Noh ..................... G01R 33/093

FOREIGN PATENT DOCUMENTS

| JP | 2009060057 A | 3/2009 |
| JP | 2012209382 A | 10/2012 |
| WO | 2014027555 A1 | 2/2014 |

OTHER PUBLICATIONS

Japanese Patent Office, Notice of Allowance issued in JP2022-553319 dated Sep. 3, 2024.

(Continued)

*Primary Examiner* — Jason Lappas
(74) *Attorney, Agent, or Firm* — Wood Herron & Evans LLP

(57) ABSTRACT

A magneto-optical memory interface includes: a memory cell structure having multiple allocated magnetic recording cells, a selection means configured to select an individual or a predetermined number of the multiple allocated magnetic recording cells of the memory structure, and configured for an electronic signal to be applicable thereto; and a light irradiation part configured to irradiate the predetermined number of the multiple allocated magnetic memory cells with an optical signal, wherein each of the magnetic recording cells is a magnetic recording cell whose sensitivity to changes in a magnetization state thereof increases in response to an irradiation light from the light irradiation part, and each of the magnetic recording cells is a magnetic recording cell whose magnetization state changes in response to an applied electrical signal resulting from selection by the selection means and the irradiation light from the light irradiation part.

9 Claims, 16 Drawing Sheets

(56) References Cited

OTHER PUBLICATIONS

Li et al., Fast and reliable storage using a 5 bit, nonvolatile photonic memory cell, Optica, 6, 1 (2019).
H. Becker et al. Out-of-Plane Focusing Grating Couplers for Silicon Photonics Integration With Optical MRAM Technology, IEEE J. Selected topic in Quan. elec., 26, 8300408 (2020).
PCT Office, International Search Report issued in PCT/JP2020/037199 dated Nov. 17, 2020.

* cited by examiner

MAGNETO-OPTICAL MEMORY INTERFACE

TECHNICAL FIELD

The present invention relates to a magneto-optical memory interface.

BACKGROUND ART

Techniques for recording optical signals and reading them out as optical signals have been developed. For example, a research team at the University of Oxford has improved a phase-change optical memory cell and demonstrated an optical memory prototype that can record 32 states corresponding to 5 bits. This type of optical memory is currently considered to have the highest recording density in the world.

Since optical signals are also used in electrical information processing circuits, an interface that converts optical signals into electrical signals at high speed and with a large capacity is also required. If such an interface is in the information processing chip, the electronic circuit can receive the optical signal directly, so that high-capacity, high-speed, low-power signal processing becomes possible. In doing so, it is important to develop a memory-type interface that converts optical signals into electrical signals and temporarily records them.

As an example of a memory-type interface that converts an optical signal into an electrical signal and temporarily records it, as described in Non-Patent Document 2 below, techniques for achieving high-speed information transfer between devices using an external laser are known, They are used for chip-to-chip optical interconnection.

CITATION LIST

Non-Patent Document

[Non-Patent Document 1]
Li et al., Fast and reliable storage using a 5 bit, nonvolatile photonic memory cell, Optica, 6, 1 (2019)
[Non-Patent Document 2]
H. Becker et al. Out-of-Plane Focusing Grating Couplers for Silicon Photonics Integration With Optical MRAM Technology, IEFE J. Selected topic in Quan. elec., 26, 8300408 (2020)

SUMMARY OF INVENTION

Technical Problem

In the magneto-optical memory interface described in Non-Patent Document 2, an optical signal propagating through an optical waveguide can be directly reflected to the magnetization state of a magnetic tunnel junction without using a photoelectric conversion element such as a photodiode; and the signal can be stored in a non-volatile manner.

However, in this conventional magneto-optical memory interface, the memory cell size is limited to the wavelength or sub-wavelength of light, so it is theoretically impossible to increase the degree of integration of the memory. Thus, there is a problem that the application is limited.

The purpose of the present invention is to provide a magneto-optical memory interface whose structure does not limit the size of memory cells to the wavelength or sub-wavelength of light, and which can increase the degree of memory integration.

Solution to Problem (1) A magneto-optical memory interface including: a memory cell structure having a plurality of magnetic recording cells allocated therein, a selection means configured to individually select one of the magnetic recording cells or select a predetermined number of the magnetic recording cells of the memory structure, and configured for an electronic signal to be applicable to selected magnetic recording cells; and a light irradiation part configured to irradiate the predetermined number of the magnetic memory cells with an optical signal, wherein each of the magnetic recording cells is a magnetic recording cell whose sensitivity to changes in a magnetization state thereof increases in response to an irradiation light from the light irradiation part, and each of the magnetic recording cells is a magnetic recording cell whose magnetization state changes due to the irradiation light from the light irradiation part and in response to an applied electrical signal resulting from selection by the selection means.

(2) In the magneto-optical memory interface of the above-described aspect of the present invention, a method for selecting the magnetic recording cells by applying the electronic signal may be one of: reduction of magnetic anisotropy due to voltage effect using voltage signal; a spin-transfer-torque using current; spin-orbit torque; and thermal reduction of magnetic anisotropy using current.

(3) In the magneto-optical memory interface of the above-described aspect of the present invention, the changes in the magnetization state may be one or more of: simultaneous rotation of magnetization; movement of a magnetic domain; and movement of a magnetic domain wall, in a magnetic layer provided to each of the magnetic recording cells.

(4) In the magneto-optical memory interface of the above-described aspect of the present invention, the magneto-optical memory interface may further include a bias magnetic field applying means for improving an error rate against the changes in the magnetization state of each of the magnetic recording cells.

(5) In the magneto-optical memory interface of the above-described aspect of the present invention, the magnetic recording cells may be arranged in a matrix in the memory cell structure.

(6) In the magneto-optical memory interface of the above-described aspect of the present invention, the magneto-optical memory may further include: reference side selection signal lines, each of which is connected to one side of magnetic recording cells for each row aligned in a horizontal direction; and opposite side selection signal lines, each of which is connected to other side of magnetic recording cells for each column aligned in a longitudinal direction, wherein any one of the magnetic recording cells of the memory cell structure is configured to be energized freely by controlling energizing of the reference side selection signal lines and the opposite side selection signal lines.

(7) In the magneto-optical memory interface of the above-described aspect of the present invention, among the reference side selection signal lines and the opposite side selection signal lines, a selection signal line provided to a side close to the light irradiation part may be made of a transparent electrode line.

(8) In the magneto-optical memory interface of the above-described aspect of the present invention, the magneto-optical memory interface may further includes: a reading means with a magnetoresistive element with a transistor; or a sensor for detecting a leakage magnetic field of a magnetic body provided to the magnetic recording cells.

(9) In the magneto-optical memory interface of the above-described aspect of the present invention, the magneto-optical memory interface may further includes: a means for writing a signal corresponding to a size of a specific magnetic domain region to the magnetic layer of the selected magnetic recording cells; a means for writing a signal corresponding to a size of a region of a specific magnetic domain corresponding to a plurality of pinning sites to the magnetic layer of the selected magnetic recording cells; or a means for writing a signal corresponding to a size of the multilevel memory to the magnetic layer of the selected magnetic recording cells.

Advantageous Effects of Invention

According to the aspect of the present invention, it is possible to provide a magneto-optical memory interface capable of reflecting and storing optical signals in a magnetized state with high density and non-volatility.

To control the magnetization state, any of the voltage effect, current effect including spin-transfer-torque and spin-orbit torque, or thermal effect is used as an assist technology for the selection of magnetic recording cells. It is also possible to write the signal as information by using the polarization-dependent optical writing technology and to read out the written information.

A method of detecting a magnetoresistive effect or a leakage magnetic field with a magnetic sensor can be used to read written information.

In this aspect, since the size of the magnetic recording cells is not restricted by the wavelength or sub-wavelength of light, high integration is possible, and the structure of the magneto-optical memory interface can be simplified.

DESCRIPTION OF EMBODIMENTS

Figure 1A:
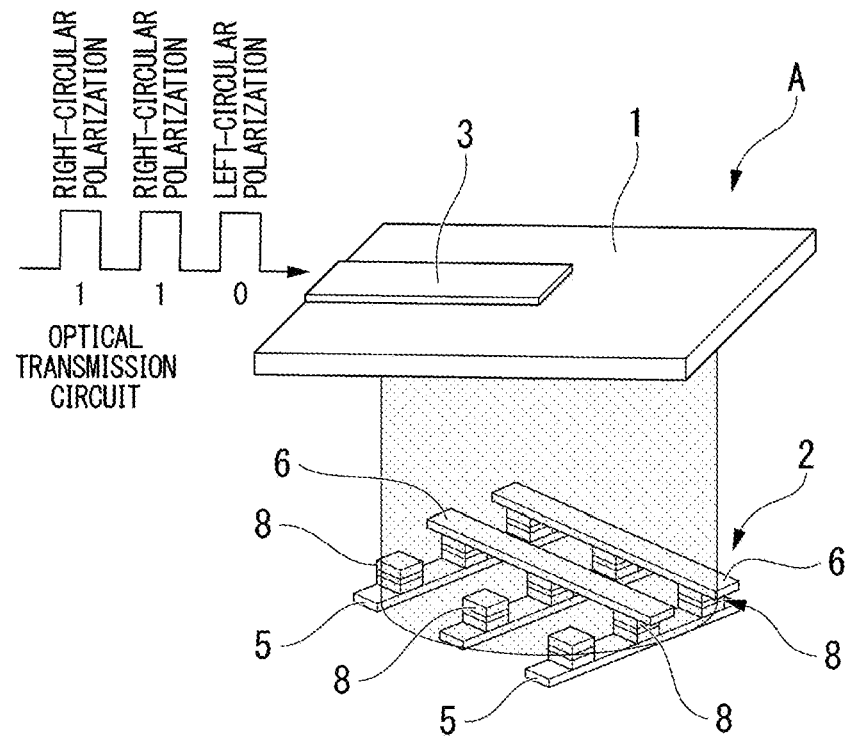
FIG. 1A is a schematic diagram of the configuration of main parts of the first embodiment of a magneto-optical memory interface related to the present invention.

An example of an embodiment of the present invention will be described in detail below with reference to the accompanying drawings. In addition, in the drawings used in the following description, in some cases, characteristic portions are enlarged for convenience in order to make the characteristics easier to understand.

FIGS. 1 and 2 show an example of a magneto-optical memory interface according to the first embodiment of the present invention. The magneto-optical memory interface A of this example comprises the optical signal irradiation part 1 and the memory cell structure 2 arranged so as to face the optical signal irradiation part 1. FIG. 1A shows an example in which the memory cell structure 2 is arranged below the light emitting surface on the lower surface side of the rectangular plate-shaped optical signal irradiation part 1.

The optical signal irradiation part 1 receives pulsed transmission light or the like transmitted from the optical transmission line 3, and a necessary region of the memory cell structure 2 provided so as to face the optical signal irradiation part 1, for example. It emits irradiation light in a spot shape. The optical signal irradiation part 1 is known as a type of out-of-plane diffraction grating coupler, and can use an element capable of converting the optical path of input light and simultaneously generating circularly polarized light.

When right-handed circularly polarized light and left-handed circularly polarized light are transmitted from the optical transmission line 3, for example, the case where the free magnetic layer, which will be described later, is in a specific magnetization state due to right-handed circularly polarized light, is referred to as "1" can be defined. Further, the case where the free magnetic layer, which will be described later, is in a specific other magnetization state due to left-handed polarized irradiation light can be defined as "0." Here, information can be held by the irradiation light that applied to the memory cell structure 2 from the optical transmission line 3 through the optical signal irradiation part 1.

According to the above definition, information corresponding to optical signals of "1" and "0" is continuously or intermittently transmitted from the optical signal irradiation part 1 to any magnetic recording cell described later in the memory cell structure 2. Magnetic information of each free magnetic layer can be stored as electric signal information by inputting to the free magnetic layers.

Figure 1B:
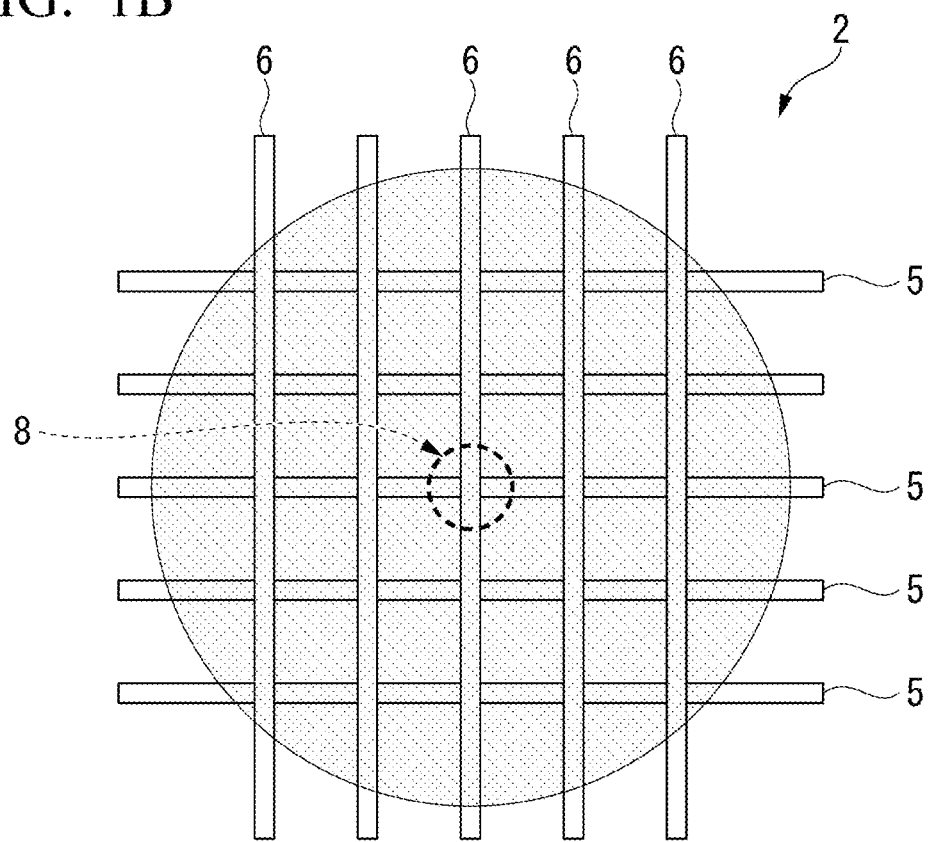
FIG. 1B is a configuration diagram showing an example of wirings incorporated in the configuration shown in FIG. 1A.

In FIG. 1B, in order to simplify the structure, multiple reference side selection signal lines 5 (five in FIG. 1) forming each row arranged in the horizontal direction and multiple opposite side selection signal lines 6 (five in FIG. 1) forming columns arranged in the longitudinal direction are arranged in the memory cell structure 2. Therefore, the memory cell structure 2 shown in FIG. 1 has a structure in which five reference side selection signal lines 5 and five opposite side selection signal lines 6 are arranged in a matrix in plane view.

In the example of FIG. 1B, five reference-side selection signal lines 5 and five opposite side selection signal lines 6 are arranged. Depending on the requirements, a structure in which the necessary number of fine width wirings, such as several thousand to several hundred thousand, is arranged in a matrix can be adopted.

Both the reference side selection signal lines 5 and the opposite side selection signal lines 6 are connected to the signal line selector such as a decoder (not shown). The selected reference side selection signal lines 5 and the opposite side selection signal lines 6 are configured to be energized.

In the example of FIG. 1, the reference-side selection signal lines 5 are made of metal wiring, and the opposite side selection signal line 6 is made of a transparent electrode line. Therefore, the irradiation light emitted from the optical signal irradiation part 1 to the memory cell structure 2 can pass through the opposite side selection signal line 6 and reach the magnetic recording cells 8, which are arranged between the opposing side selection signal line 6 and the reference side selection signal line 5 and described later.

Figure 2A:
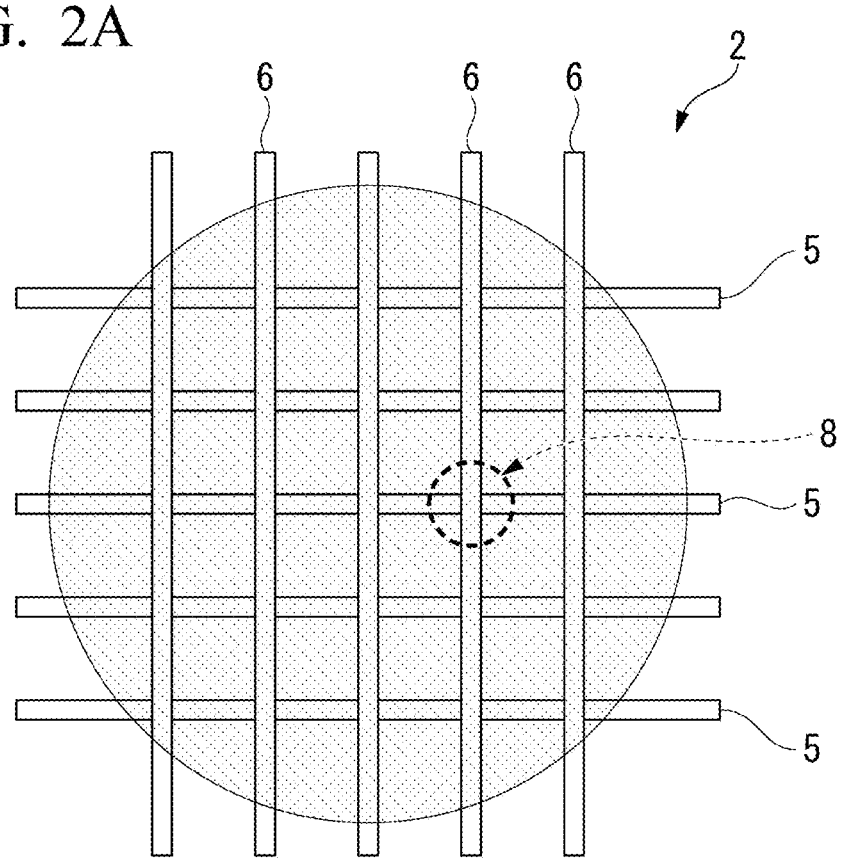
FIG. 2A is a configuration diagram showing an example of the same wirings as in FIG. 1B.

In the present embodiment, the optical signal irradiation part 1 is formed in such a way that it can irradiate light in a spot shape on all intersections of the reference side selection signal line 5 and the opposite side selection signal line 6, as illustrated in FIGS. 1B and 2A. The range to which the optical signal irradiating part 1 can irradiate light is not limited to the above-described explanation, and light may be radiated to more intersecting portions according to the degree of integration of signal lines, the optical signal irradiating section, and the like. Further, multiple optical signal irradiation parts 1 may be provided according to the arrangement intervals and the number of signal lines so that light can be irradiated. That is, the optical signal irradiation parts 1 can be configured to irradiate an arbitrary number of magnetic recording cells 8 with optical signals.

Figure 2B:
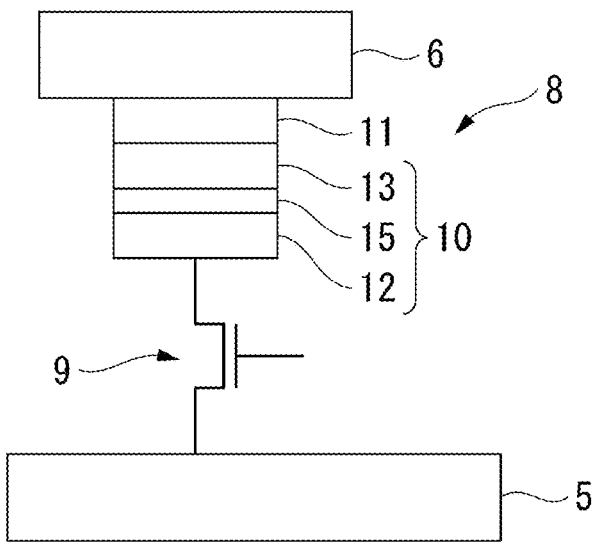
FIG. 2B is an explanatory diagram showing an example of the configuration of a magnetic recording cell in the magneto-optical memory interface of the first embodiment.

In the magneto-optical memory interface A shown in FIG. 1A, the magnetic recording cells 8 having the laminated structures shown in FIG. 2B, for example, are formed at the intersections of the reference side selection signal line 5 and the opposite side selection signal line 6. The configuration of FIG. 1B shows an example in which five reference side selection signal lines 5 and five opposite side selection signal lines 6 are provided. Thus, 25 intersections of these signal lines are provided, and magnetic recording cells 8 are provided at all the intersections. For this reason, magnetic recording cells 8 (25 of them) are arranged in the magneto-optical memory interface A of this embodiment. It is not necessary to provide the magnetic recording cells 8 at all intersections of the signal lines, and the required number of magnetic recording cells 8 can be provided.

In the magnetic recording cell 8, the cell selection element 9 such as the cell selection transistor or the cell selection diode, the magnetic tunnel junction 10, and the optical spin conversion layer 11 are laminated on the reference side selection signal line 5; and the opposite side selection signal lines 6 are formed on the optical spin conversion layer 11. Accordingly, each of the reference side selection signal lines 5 is connected to one side of each of the magnetic recording cells, and each of the opposite side selection signal lines 6 is connected to the other side of each of the magnetic recording cells 8. With the above structure, by energizing a specific reference side selection signal line 5 and a specific opposite side selection signal line 6, voltage can be applied to a specific magnetic recording cell 8 located at an intersection of the specific reference-side selection signal line 5 and the specific opposing side selection signal line 6 among the magnetic recording cells 8 arranged in a matrix.

With the above configuration, one reference side selection signal line 5 is connected to one side of each magnetic recording cell 8 in each row arranged in the horizontal direction among the magnetic recording cells 8 arranged in a matrix as shown in FIG. 1B. In addition, one opposite side selection signal line 6 is connected to the other side of each magnetic recording cell 8 in each column arranged in the vertical direction. The memory interface A is configured in such a way that an arbitrary number of magnetic recording cells 8 provided at each intersection can be selected and energized by controlling energization to each reference side selection signal line 5 and energization control to each opposing side selection signal line 6.

A necessary number of insulating layers (not shown) are laminated between the reference side selection signal line 5 and the opposite side selection signal line 6 and around each magnetic recording cell 8. The reference side selection signal line 5 and the opposing side selection signal line 6 are individually insulated, and the adjacent magnetic recording cells 8 are also individually insulated. If the cell selection element 9 is a cell selection transistor, a control wiring is required for connection to the base of each cell selection transistor. However, images of these control wirings are omitted in FIG. 2. The control wiring is connected to a separately provided control wiring selector, and configured to control switching of any selected cell selection transistor as required.

For the magnetic tunnel junction 10, for example, a structure in which an intermediate layer 15 serving as a tunnel barrier is interposed between the pinned magnetic layer 12 and the free magnetic layer 13 can be adopted. With this structure, the magnetic recording cells 8 can be selected according to the voltage system, as shown in FIGS. 3A to 3D.

As shown in FIG. 3A, in the initial state where no voltage is applied, the axis of easy magnetization of the free magnetic layer 13 is oriented perpendicular to the film surface of the free magnetic layer 13. Here, the direction of perpendicular magnetization is, for example, vertically upward with respect to the film surface of the free magnetic layer 13. A weak magnetic field (bias magnetic field) may be applied in the direction parallel to the film surface of the free magnetic layer 13 as needed. The bias magnetic field can be generated by a bias magnetic field generating layer (not shown) disposed near the free magnetic layer 13 or the like. This bias magnetic field generating layer serves as a bias magnetic field applying means.

Figure 3:
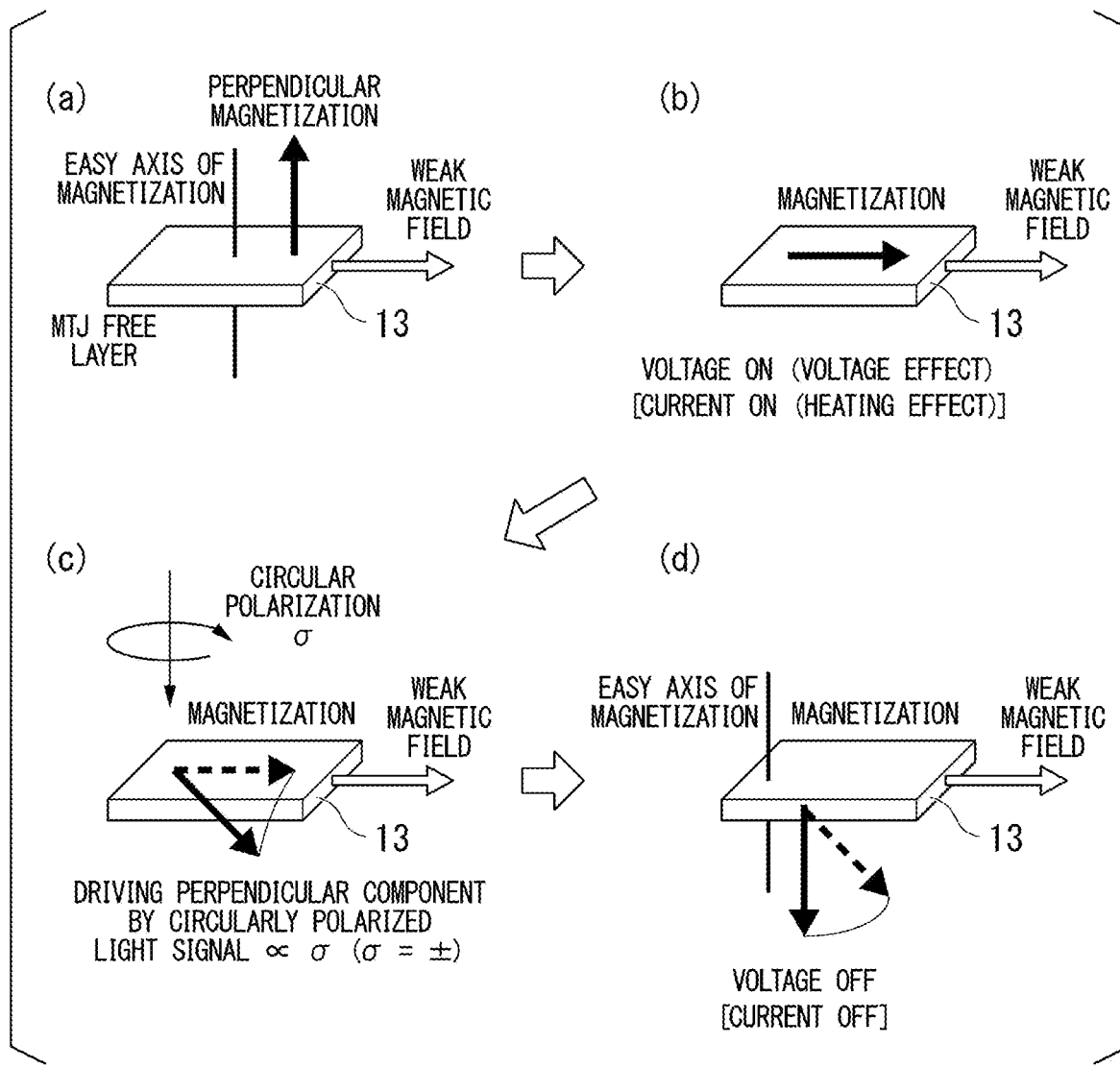
FIG. 3 includes diagrams for explaining examples in which the direction of magnetization changes due to a voltage effect and light irradiation in the same magnetic recording cell. (a) is an explanatory drawing showing the magnetization direction in the initial state in the layer. (b) is an explanatory drawing showing an example of the magnetization direction of the free magnetic layer in a state where voltage or current is applied. (c) is an explanatory diagram showing an example of the result of driving the perpendicular component of the magnetization of the free magnetic layer by a circularly polarized light signal. (d) is an explanatory diagram showing the magnetization direction of the free magnetic layer when the applied voltage or current is turned off.

When a voltage is applied to the magnetic tunnel junction 10 using the reference side selection signal line 5 and the opposite side selection signal line 6, the magnetic anisotropy of the free magnetic layer 13 disappears due to the voltage effect, the magnetization direction of the free magnetic layer 13 rotates as shown FIG. 3 (*b*), and becomes parallel to the film surface of the free magnetic layer 13, for example. For example, the direction is the same as the direction of the bias magnetic field shown in FIG. 3B.

Depending on the structure of the magnetic tunnel junction 10, the magnetic anisotropy can also be quenched by the heating effect of the applied current.

Next, as shown in FIG. 3C, when irradiation light having a circularly polarized component (circularly polarized signal) is irradiated from the optical signal irradiation part 1 to the optical spin conversion layer 11, direction of magnetization can be rotated downward at a predetermined angle with respect to the direction of the film surface of the free magnetic layer 13 by the influence of the circularly polarized signal. In other words, it is possible to drive the perpendicular component of magnetization.

From this state, when the voltage application by the reference side selection signal line 5 and the opposite side selection signal line 6 is turned off (released), or the applied current is turned off (released), the perpendicular magnetization state as shown in FIG. 3D, in which the direction is 180° different from that in the initial state shown in FIG. 3A, can be obtained.

As shown in FIGS. 3A to 3D, the magnetization direction of the free magnetic layer 13 can be changed in multiple directions. Depending on the direction of magnetization of the free magnetic layer 13, different resistance states can be obtained, and they have different resistance values. Therefore, by reading the resistance value according to the magnetization direction of the free magnetic layer 13, it is possible to record information as "0" or "1" when the resistance is high or low.

The magnetic information once input is retained as it is unless voltage or current is applied. Thus, the information is non-volatile information.

In the magneto-optical memory interface A shown in FIGS. 1 and 2, the memory cell structure 2 is irradiated with right-handed circularly polarized light or left-handed circularly polarized light, and an electric signal is applied to the magnetic recording cell 8 to be written. Then, since the magnetization state of the magnetic recording cell 8 has improved sensitivity due to the aforementioned circularly polarized irradiation light, it is possible to change the magnetization state of the free magnetic layer 13 of only the selected specific magnetic recording cell 8. In other words, in response to the irradiation light from the light irradiation part 1, the sensitivity of the magnetization state change of the free magnetic layer 13 of the magnetic recording cell 8 itself irradiated with the irradiation light increases.

The magnetization state change can be applied to simultaneous rotation of the entire magnetization of the free magnetic layer 13, as well as movement of various magnetic domains and domain walls, which will be described later. Regarding the state of the magnetic domain, in addition to displaying whether or not the magnetization of the entire free magnetic layer 13 has rotated all at once with two types of "1" and "0", it can also be employed as a magnetic domain state having multiple stable states as describe below.

When applying voltage or current to the magnetic recording cell 8 to read the magnetic domain state of the free magnetic layer 13, a bias magnetic field may be applied as shown in FIG. 3 in order to improve the error rate.

When reading the magnetization state of the free magnetic layer 13 of the magnetic recording cell 8, the reading may be performed using an array (reading means) using magnetoresistive elements with transistors. Alternatively, reading may be performed with a magnetic sensor that detects a leakage magnetic field from the free magnetic layer 13 at a cross point without a transistor cell.

Figure 4A:
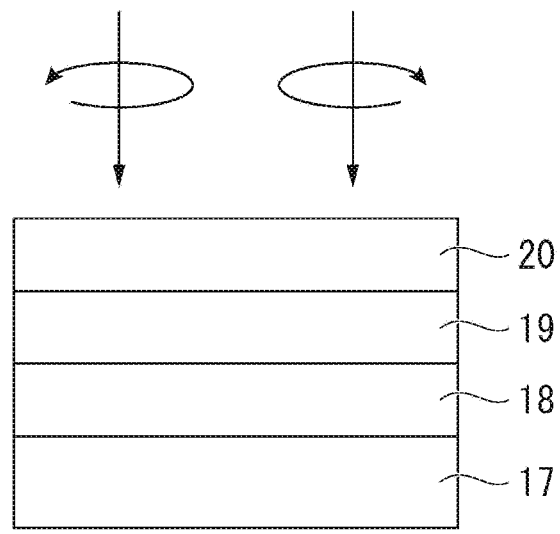
FIG. 4A is an explanatory diagram showing an example of a laminated structure suitable for driving the magnetization direction of a magnetic material by circularly polarized light pulse irradiation in the same magnetic recording cell.

FIG. 4A is an explanatory diagram showing an example of a laminated structure in which the polar Kerr rotation angle changes due to circularly polarized pulse irradiation. For example, the nonmagnetic metal layer (barrier layer) 18 made of MgO, the free magnetic layer (ferromagnetic layer) 19 made of FeCo layer having a thickness of 2 nm, and the optical spin conversion layer 20 made of Pt are formed on a Si(100)/SiO$_2$ substrate 17 are stacked. As an example, the thickness of the non-magnetic metal layer 18 can be selected to be 2 nm, the thickness of the free magnetic layer 19 to 1 nm, and the thickness of the optical spin conversion layer 20 to 5 nm.

Figure 4B:
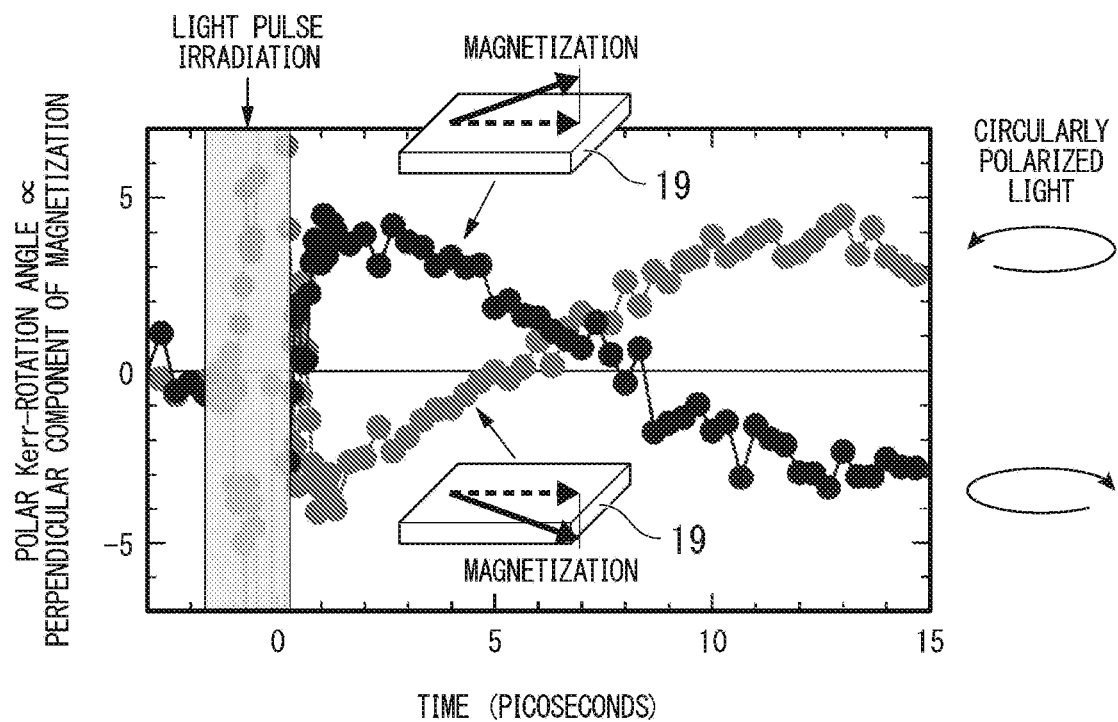
FIG. 4B shows the polar Kerr rotation angle (°) and time (1 is a graph showing the relationship between picoseconds).

In the laminated structure shown in FIG. 4A, when left-handed circularly polarized light or right-handed circularly polarized light is irradiated as pulsed light, the polar Kerr rotation angle (perpendicular component of magnetization) changes with elapsed time (picoseconds) as shown in the graph of FIG. 4B. For example, the conditions for obtaining the change in the graph shown in FIG. 4B are in-plane magnetic field: 1 tesla, light 1 pulse energy density: about 1 mJ/cm$^2$, and pulse width: about 120 fs. The polar Kerr rotation angle changes in the double layer of the free magnetic layer 19 made of a ferromagnetic layer and the non-magnetic metal layer 18 in the state where no voltage is applied.

As shown in the schematic diagram drawn on the upper side of the graph in FIG. 4B, the initial state is a magnetization having an obliquely upward component with respect to the film surface of the free magnetic layer 19 by irradiation with clockwise circularly polarized light. Precession occurs with the passage of time. On the other hand, as shown in the schematic drawn at the bottom of the graph in FIG. 4B, the initial state is set as the magnetization having an obliquely downward magnetization component with respect to the film surface of the free magnetic layer 19 by irradiation with left-handed circularly polarized light. From the initial state, precession of magnetization occurs with the passage of time.

FIG. 4B shows that the double layer of the free magnetic layer 19 and the non-magnetic metal layer 18 is irradiated with circularly polarized pulses having different circular polarization helicities for a predetermined period of time to generate a typical magnetization precession excited.

By applying the laminated structure shown in FIG. 4A to the magnetic tunnel junction 10 shown in FIG. 2, the perpendicular component of magnetization can be driven by left-handed circularly polarized light or right-handed circularly polarized light shown in FIG. 3C.

In the example described with reference to FIGS. 1 to 4, the selection element 9 such as a cell selection transistor or a cell selection diode is used as the means for selecting the magnetic recording cell 8. However, as the selection element 9, a selection element utilizing various phenomena described below may be used.

Figure 5:
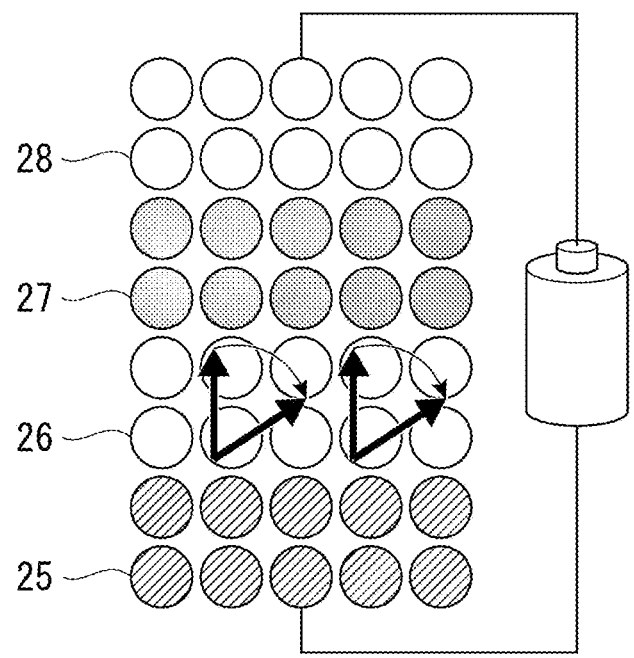
FIG. 5 is an explanatory view showing an example of a lamination structure in the same magnetic recording cell that enables cell selection by changing the magnetic anisotropy of a magnetic material due to a voltage effect using a voltage signal.

The structure shown in FIG. 5 includes an MgO layer (not shown) having a thickness of 3 nm, the chromium layer 25 having a thickness of 30 nm, the Fe layer 26 having a thickness of 0.8 nm, and the Fe layer 26 having a thickness of 2.0 nm on an MgO (001) substrate (not shown). An element having a structure in which the 3 nm thick MgO layer 27 and the 10 nm thick Fe layer (ultra-thin Fe layer) 28 are laminated is shown.

This device is known as a MgO-based tunnel junction (MTJ) device with an ultra-thin Fe layer and is known to exhibit large voltage-induced changes in perpendicular anisotropy.

Therefore, by using the element having the laminated structure shown in FIG. 5, the voltage-induced change that reduces the magnetic anisotropy by the voltage signal can be used as a method of selecting the magnetic recording cell 8.

Figure 6:
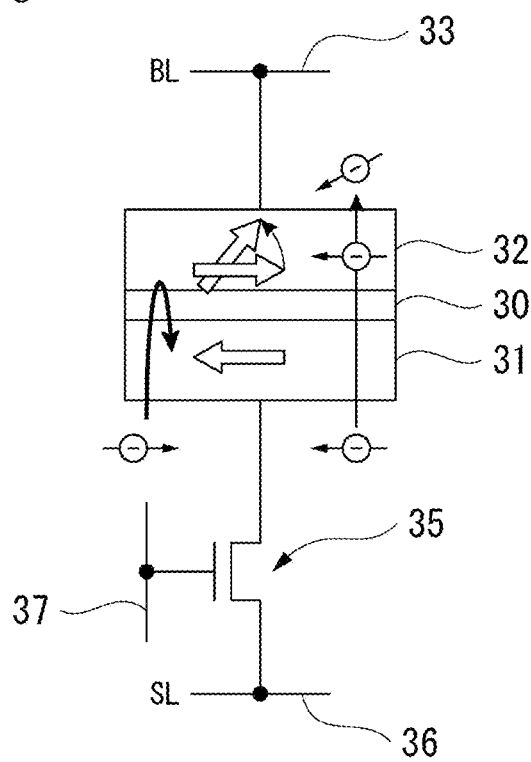
FIG. 6 is an explanatory diagram showing an example of a lamination structure in which cell selection is possible by changing the magnetization direction of a magnetic material due to spin-transfer-torque using current in the same magnetic recording cell.

The configuration shown in FIG. 6 is known as an example of a switching device using a magnetic tunnel junction (MTJ). With respect to the structure in which the barrier layer 30 is sandwiched between the fixed magnetic layer 31 and the free magnetic layer 32, the bit wiring 33 is connected to the free magnetic layer 32 side, and the source wiring 36 is connected to the fixed magnetic layer 31 side through the selection transistor 35, a word wiring 37 is connected to the base of the selection transistor 35. As an example of the layered structure, a layered structure of SiO$_2$ substrate/Ta(S)Ru(10)/Ta(5)/CoFeB(1.0)MgO(0.85)/CoFeB (1.7)/Ta(5)Ru(5)/Cr/Au (numerical value is film thickness: unit: nm) can be exemplified.

In the initial state, the magnetization direction of the free magnetic layer 32 is influenced by the magnetization direction of the pinned magnetic layer 31 and aligned in the film surface direction. STT (spin transfer torque) can be applied to the magnetization of the free magnetic layer 32 by applying current, and when the threshold value is exceeded, the direction of magnetization of the free magnetic layer 32 can be changed. By utilizing this phenomenon, the direction of magnetization can be changed slightly when clockwise or counterclockwise circularly polarized light is applied, thereby facilitating magnetization reversal by circularly polarized light. Therefore, by using the element having the structure shown in FIG. 6, the spin injection torque using current can be used as a method of selecting the magnetic recording cell 8.

Figure 7:
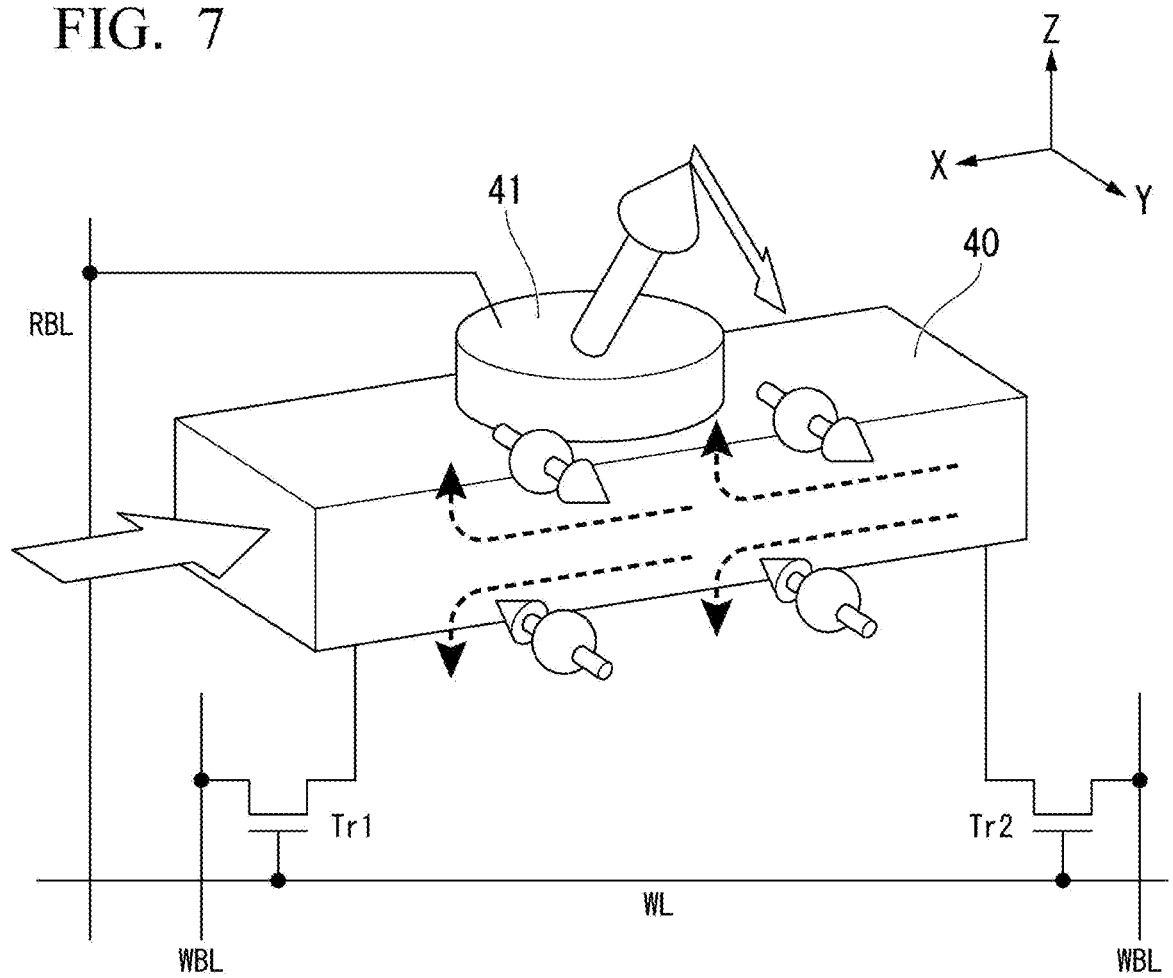
FIG. 7 is an explanatory diagram showing an example of a lamination structure in the same magnetic recording cell that enables cell selection by changing the magnetization direction of a magnetic material due to spin-orbit torque using current.

The configuration shown in FIG. 7 is a structure known as a spin-orbit torque-induced switching device. In this configuration, magnetization can be switched by using a current applied to the Ta channel 40 to generate a spin-orbit torque (SOT) that acts on free magnetic layers in an adjacent laminate 41 using spin-orbit interactions.

As an example of the Ta channel and lamination structure, a lamination structure of Ta(10)/CoFeB(1.46)/MgO(0.8)/CoFeB(1.5)/Co(0.8)/Ru(0.92)/Co(2.7)/Ru(5) (the numerical value indicates the film thickness nm) can be exemplified.

In the configuration shown in FIG. 7, either the X direction or the Y direction in the film surface direction of the laminate and the Z direction as the thickness direction of the film surface can be selected as the direction of the axis of easy magnetization. For example, in a structure in which the axis of easy magnetization is oriented in the Z direction, a current is passed through the Ta channel 40 to generate a spin-orbit torque (SOT), and the magnetization direction of the free magnetic layer provided in the laminate 41 can be changed.

The circuit can be configured by arranging the Select transistors Tr1 and Tr2 at both ends of the Ta channel 40, respectively; connecting the bases of both transistors to the word wiring WL; connecting the top of the laminate 41 to the read-side bit wiring RBL; and connecting the other transistors of both transistors to the word wiring WL to configure a switching device.

Therefore, by using the element having the structure shown in FIG. 7, the magnetization direction can be slightly changed when the right-handed circularly polarized light or the left-handed circularly polarized light is irradiated, and the magnetization reversal by the circularly polarized light can be easily performed. Therefore, the spin-orbit torque due to current can be used as a method of selecting the magnetic recording cell 8.

Figure 8A:
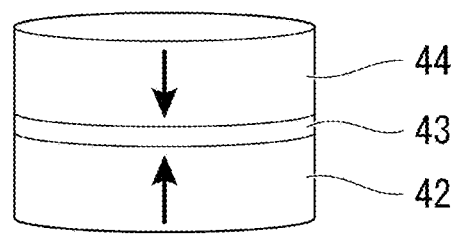
FIG. 8A is an explanatory view showing the magnetization direction of the magnetic layer at the temperature in the standby state in an example of the laminated structure in which the cell can be selected by reducing the magnetic anisotropy due to Joule heating using electric current in the same magnetic recording cell.
Figure 8B:
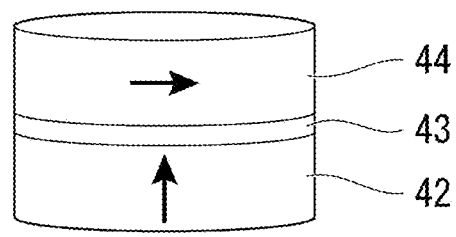
FIG. 8B is an explanatory diagram showing the direction of magnetization in a state where the perpendicular magnetic anisotropy is reduced during heating in one example of the laminated structure.

FIGS. 8A and 8B show configuration examples of switching devices using a reduction in magnetic anisotropy thermally induced by current using a perpendicular magnetic tunnel junction.

In FIG. 8A, the magnetic tunnel junction (MTJ) structure can adopt a seed layer/SAF layer/MgO barrier layer/free magnetic layer/cap layer structure. As an example, the SAF layer can adopt a laminated structure of Ta(3)/Pt(5)/[Co(0.5)/Pt(0.4)]$_{x5}$/Co(0.5)/Ru(0.9)/[Co(0.5)/Pt(0.4)]$_{x3}$/Co60Fe20B20(1.5) (numerical values indicate film thickness nm). For the free magnetic layer, for example, a laminated structure of Co60Fe20B20(1.2)/[Pd(1.2)/Co(0.3)]$_{x3}$ can be adopted. In FIG. 8, a laminated structure having the SAF layer (antiferromagnetic junction layer) 42, the MgO barrier layer 43, and the free magnetic layer 44 are shown as a simplified model.

As shown in FIG. 8A, a large PMA (perpendicular magnetic anisotropy) is exhibited at the temperature in the standby state, but when the current is applied and heated, it is affected by TIAR (thermally induced anisotropy reorientation), and the PMA becomes is reduced as shown in FIG. 8B; and the magnetization of the free magnetic layer 44 is directed in-plane. By irradiating right-handed circularly polarized light or left-handed circularly polarized light in this state, magnetization reversal by circularly polarized light can be performed in the same process as the voltage application.

Therefore, the element having the structure shown in FIGS. 8A and 8B can be used as a method for selecting the magnetic recording cell 8.

FIGS. 9 and 10 are explanatory diagrams showing an example of using movement of a domain wall by a current method as a change in the magnetization state instead of the change in the magnetization state due to the simultaneous rotation of the magnetization in the free magnetic layer 13 described above.

FIGS. 9 and 10 show a structure in which the magnetic domain wall 45A can be moved by applying a current in the free magnetic layer 45 of the magnetic wire in which the magnetic layers and the like are laminated in a wire shape. In this structure, the free magnetic layer 45 of the magnetic wire has two left and right magnetic domains 46 and 47 as shown in FIG. 9A.

As an example configuration of the magnetic wire, a magnetic wire made of a six-layer laminated structure of Ta(3 nm)/Pt(5 nm)/Co(0.3 nm)/Ni(0.6 nm)/Co(0.3 nm)/Pt(2 nm) (numbers indicate film thickness) formed on a glass substrate can be adopted.

Figure 9A:
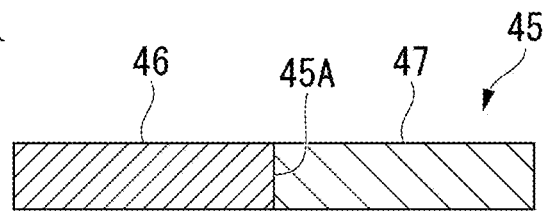
FIG. 9A is an explanatory diagram showing a first example of a structure in which data can be written in an analog manner in addition to cell selection in the same magnetic recording cell. It is an explanatory view showing a state.
Figure 9B:
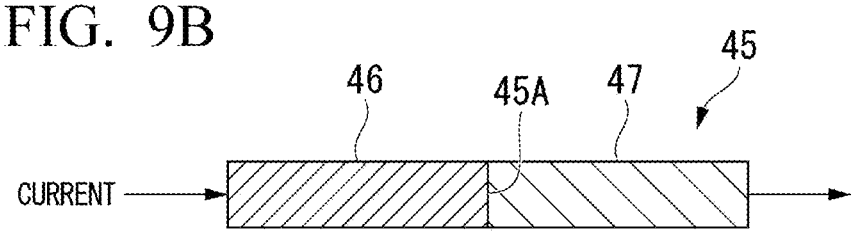
FIG. 9B is an explanatory diagram showing a state in which a current is applied to the same magnetic layer.

A current is applied to the free magnetic layer 45 of the magnetic wire in the longitudinal direction (horizontal direction in FIG. 9A) as shown in FIG. 9B to heat the free magnetic layer 45 of the magnetic wire. This current heating can lower the energy barrier that stops domain wall movement in the free magnetic layer 45 of the magnetic wire. However, the domain wall does not move simply by passing a current through the free magnetic layer 45 of the magnetic wire. The free magnetic layer 45 of the magnetic wire exhibits, for example, a coercivity (Hc) of 35 Oe and a saturation magnetization (Ms) of 770 emu/cm$^3$.

Figure 9C:
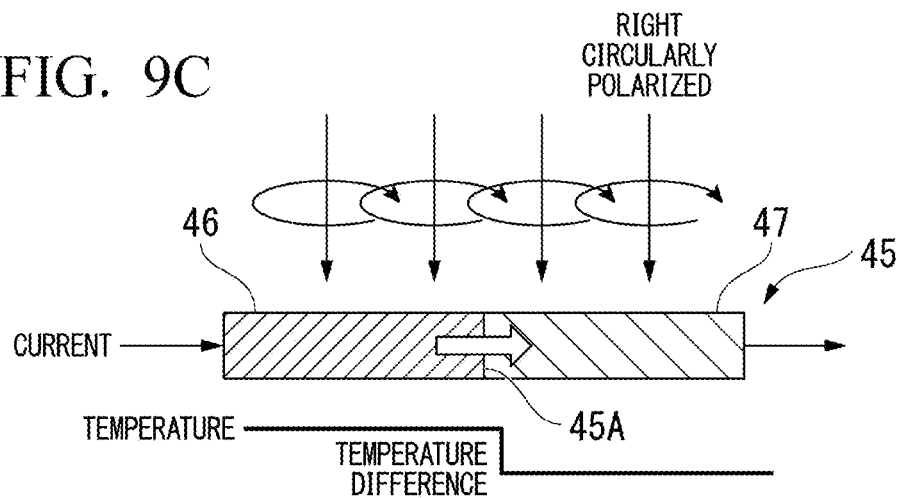
FIG. 9C is an explanatory view showing a state in which the same magnetic layer is irradiated with right-handed circularly polarized light.
Figure 9D:
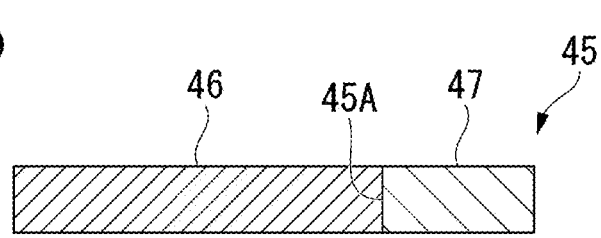
FIG. 9D is an explanatory diagram showing a state in which the magnetic domain wall moves and the magnetic domain on the left expands in the same magnetic layer.

Here, when the Pt surface layer on the surface of the magnetic wire is irradiated with right-handed circularly polarized laser pulse light as shown in FIG. 9C while current heating is continued, domain wall movement occurs due to thermal spin current drag, resulting in expansion of the magnetic domain 46 on the left and contraction of the magnetic domain 47 on the right. Next, when the current is turned off as shown in FIG. 9D, the movement of the domain wall 45A stops, resulting in the expansion of the left domain 46 and the contraction of the right domain 47 as shown in FIG. 9D.

Under the same conditions, when the surface of the magnetic wire is irradiated with left-handed circularly polarized laser pulse light, domain wall movement due to thermal spin current drag occurs on the opposite side to that shown in FIG. 9; and a state, in which the magnetic domain 46 on the left side expands and the magnetic domain 47 on the right side contracts, is obtained. By properly using right-handed circularly polarized light and left-handed circularly polarized light in this manner, the movement of the domain wall 45A can be controlled to the right or to the left.

Figure 10A:
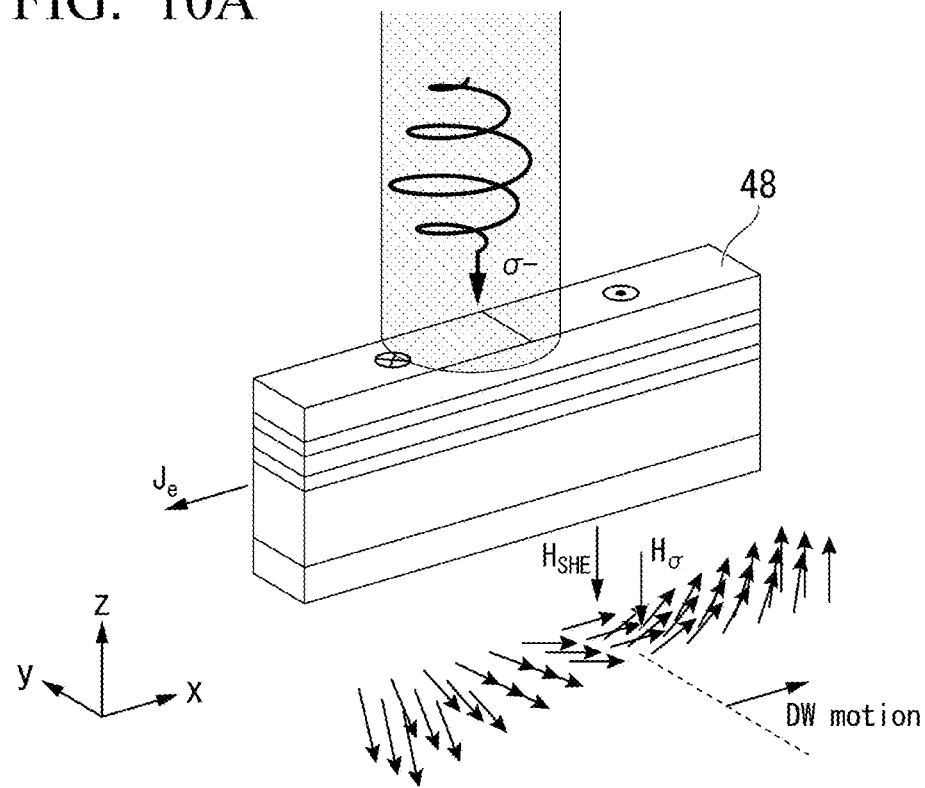
FIG. 10A is an explanatory view showing a state in which a left-handed circularly polarized laser pulse is incident on a specific example of a laminated structure in which data can be written in an analog manner in addition to cell selection in the same magnetic recording cell.
Figure 10B:
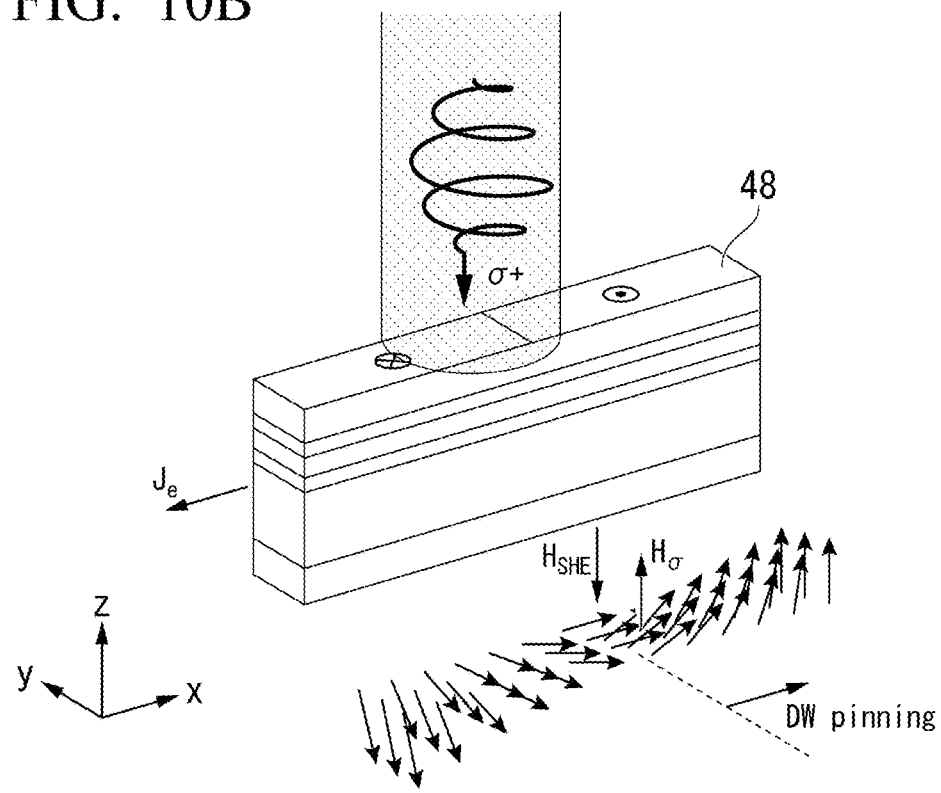
FIG. 10B is an explanatory diagram showing a state in which a right-handed circularly polarized laser pulse is incident on the specific example of the laminated structure.

FIG. 10A shows a laminate 48 having a six-layer structure of Ta/Pt/Co/Ni/Co/Pt. The state of the domain wall movement when the upper surface of the laminate 48 is irradiated with left-handed circularly polarized laser pulse light is schematically shown. FIG. 10B shows the state at the time of domain wall movement when a right-handed circularly polarized laser pulse light is irradiated. By selecting an appropriate laser pulse light and current application, the domain wall can be moved.

This domain wall movement can be used as a change in the magnetization state of the free magnetic layer in the same manner as in the previous embodiment. According to the structures shown in FIGS. 9 and 10, the movement amount of the domain wall can be controlled by adjusting the irradiation conditions of the circularly polarized light and the current application conditions. This means that it is possible not only to select the magnetic recording cell 8 but also to write analog information.

Figure 11:
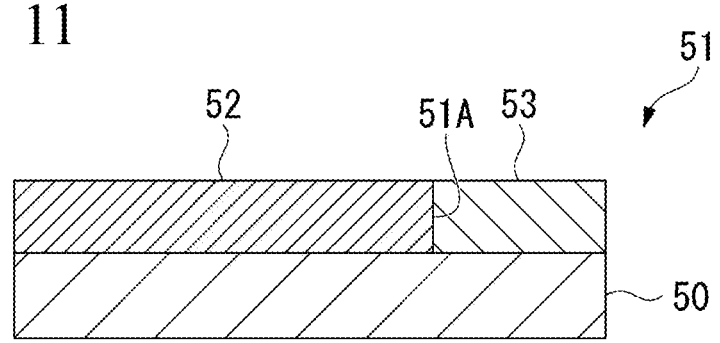
FIG. 11 is an explanatory diagram showing a second example of a laminated structure in which data can be written in an analog manner in addition to cell selection in the same magnetic recording cell.

FIG. 11 is an explanatory diagram showing an outline of a laminated structure in which pinning sites are introduced into the free magnetic layer 51 by laminating the free magnetic layer 51 on the antiferromagnetic layer 50. In FIG. 11, the free magnetic layer 51 is divided into two specific magnetic domains 52 and 53, and a domain wall 51A is formed at the boundary between them.

As an example of a detailed laminated structure, a laminate structure of Ta(3)/Pt(4)/PtMn($t_{PtMn}$)/[Co(0.3)/Ni(0.6)]$_2$/Co(0.3)/MgO(1.2)/Ta(2) (the numerical value indicates the film thickness (unit: nm)) can be adopted. In this structure, the antiferromagnetic layer 50 is made of PtMn, and the free magnetic layer 51 is made of [Co(0.3)/Ni(0.6)]2/Co(0.3).

In the laminated structure shown in FIG. 11, the domain wall is pinned and does not move even when the right-handed circularly polarized light is irradiated, as in the case shown in FIG. 9C. When a current is applied here and an SOT (spin orbit torque) assist current or an STT (spin transfer torque) assist current is applied, only the free magnetic layer 51 corresponding to the magnetic recording cell 8 moves the domain wall 51A.

As the domain wall 51A moves, the regions of the specific magnetic domains 52 and 53 expand or contract.

Figure 12:
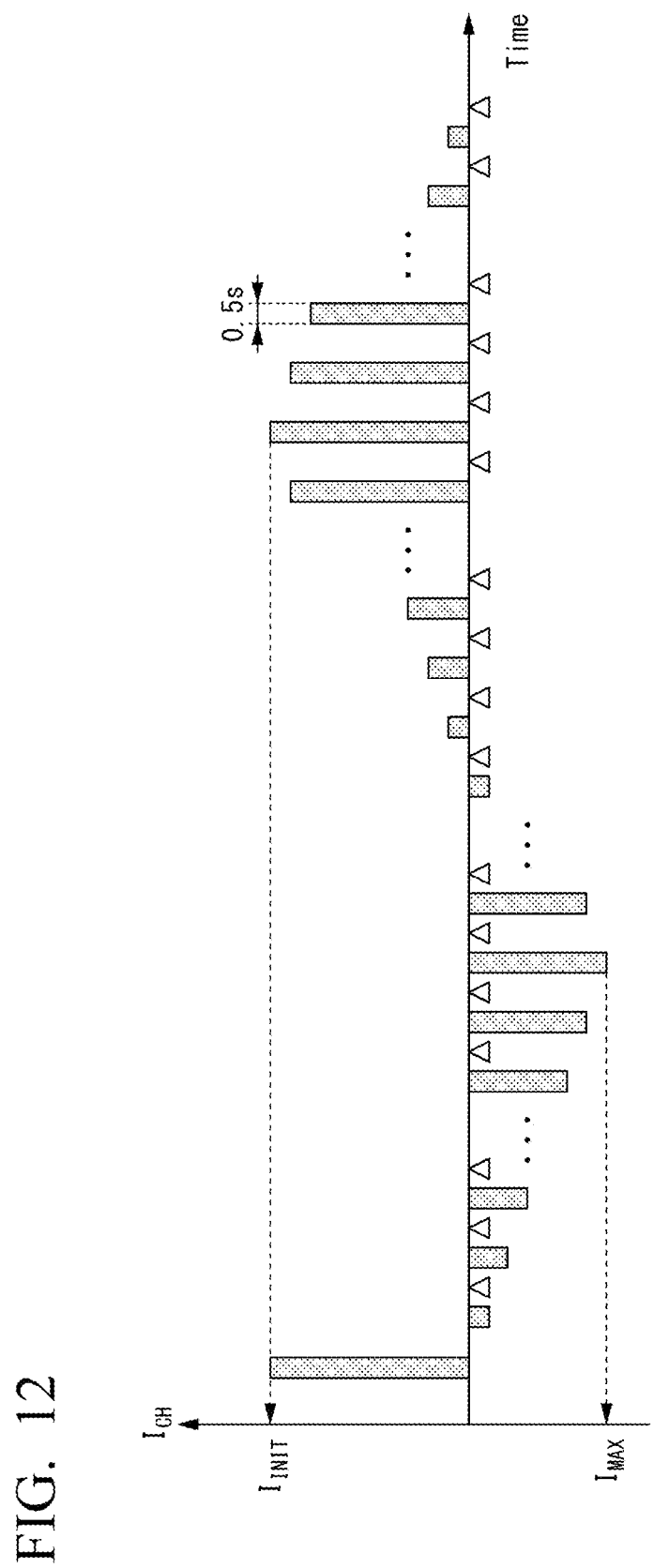
FIG. 12 is an explanatory diagram showing ICH pulses and RH measurement positions when obtaining an RH (Hall resistance)-ICH (channel current) loop in the second example.
Figure 13:
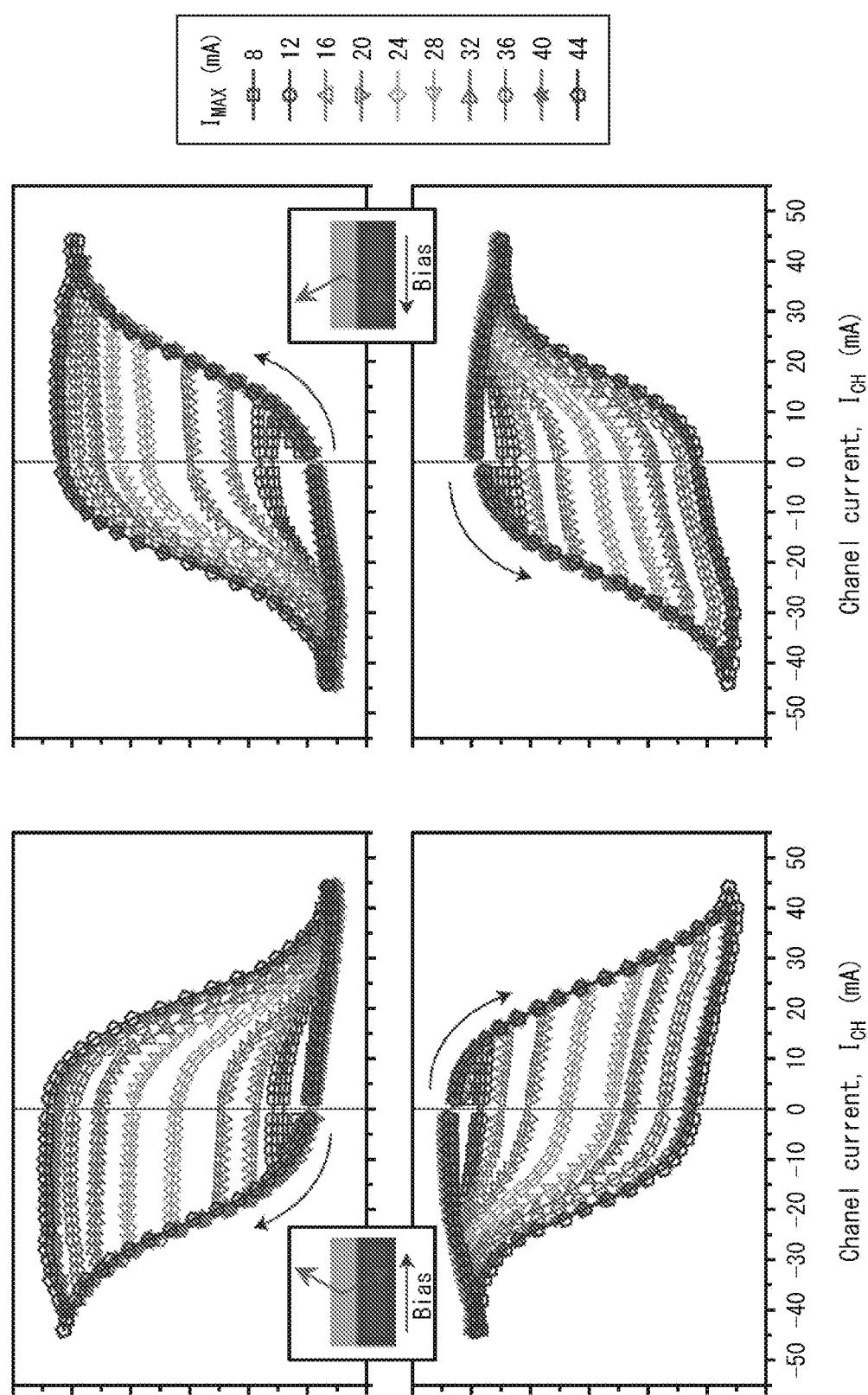
FIG. 13 is an explanatory diagram showing an example of the RH—ICH loop obtained in the second example.

FIG. 13 shows an example of the characteristics obtained by the above-described laminated structure. As shown in FIG. 12, the initial pulse of magnitude $I_{INT}$ is first applied to the laminate, followed by the sequence of $I_{CH}$ pulses of varying magnitudes and durations of 0.5 seconds, and RH after each pulse application is measured. In this case, the perpendicular magnetization is reversed only by current-induced torque and circularly polarized laser irradiation, and RH at the midpoint of the loop varies gradually with $I_{MAX}$.

The fact that this result is obtained means that in the structure of FIG. 11, it is possible not only to select the magnetic recording cells 8 but also to write analog information as a multilevel memory.

Moreover, when the structure shown in FIG. 11 is employed, optical signals can be recorded in multiple values, and application to a brain-type information processing interface, for example, is also possible.

In the example described above, the examples in which magnetic recording cells having the same structure are provided at all the intersections of the reference-side selection signal lines 5 and the opposing-side selection signal lines 6 have been described. However, magnetic recording cells with different configurations may be applied to the intersections of the reference-side selection signal lines 5 and the opposing-side selection signal lines 6.

For example, two or more magnetic recording cells selected from: the magnetic recording cell 8 shown in FIGS. 2-3; and the magnetic recording cell shown in FIG. 4A; the magnetic recording cell having the lamination structure shown in FIG. 5; the magnetic recording cell having the lamination structure shown in FIG. 6; the magnetic recording cell having the lamination structure shown in FIG. 7; the magnetic recording cell having the lamination structure shown in FIG. 8; the magnetic recording cell having the lamination structure shown in FIG. 9; the magnetic recording cell having the lamination structure shown in FIG. 10; and the magnetic recording cell having the lamination structure shown in FIGS. 11, can be applied to the intersections.

When applying two or more types of magnetic recording cells, multiple light irradiation units 1 may be provided, and a specific magnetic recording cell may be provided for each region where each irradiation unit 1 irradiates an optical signal. Also, two or more types of magnetic recording cells may be applied to a region where one light irradiation unit 1 irradiates an optical signal.

Figure 14:
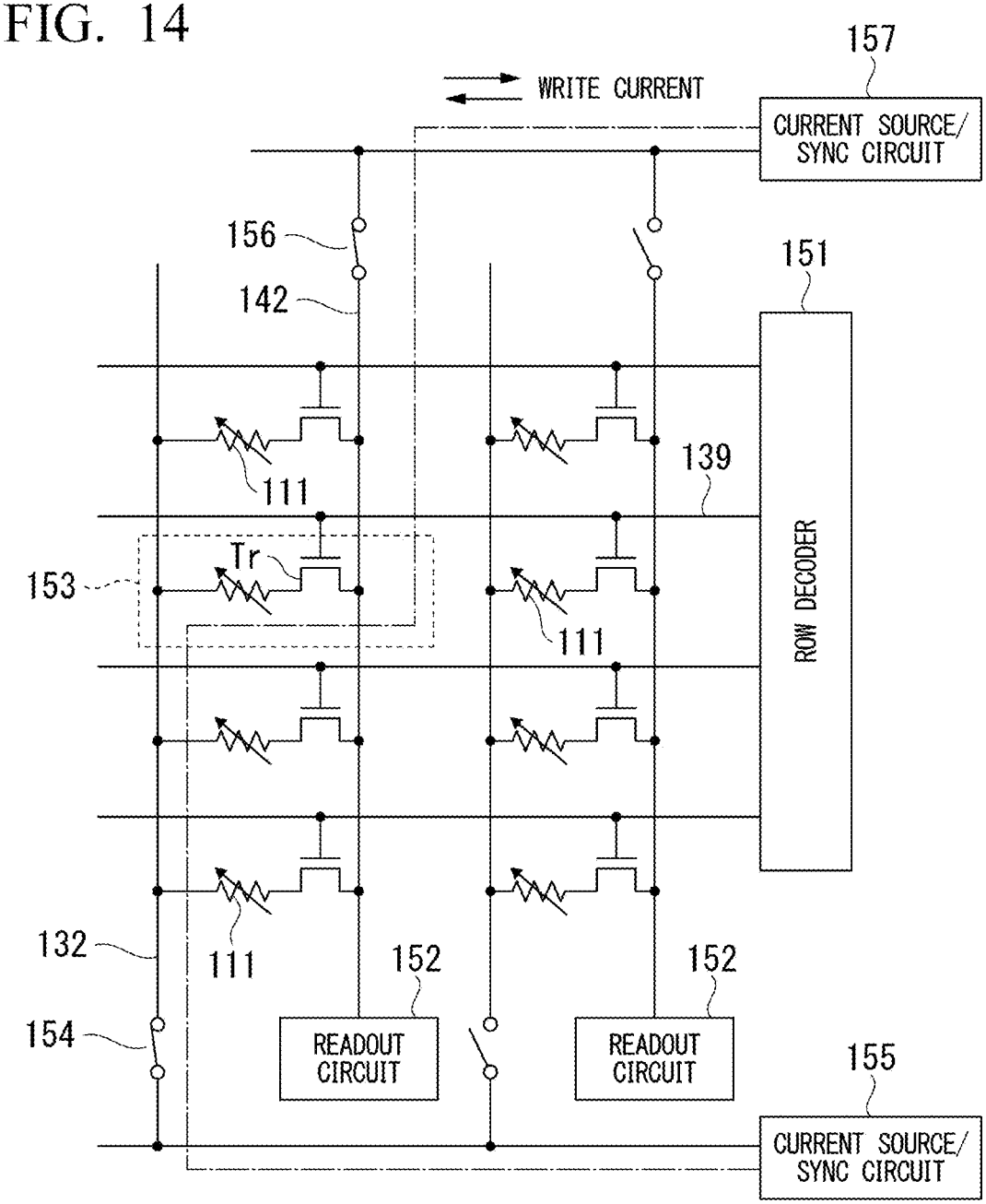
FIG. 14 is an explanatory diagram showing a circuit diagram when reading out recording applied to the same magnetic recording cell by the magnetoresistive effect and performing current assist or voltage assist.

FIG. 14 is a circuit diagram showing the main part of a memory applicable to the magneto-optical memory interface of this embodiment.

In the circuit diagram of FIG. 14, the memory cells 153 each including a magnetic tunnel junction and the selection transistor Tr indicated by reference numeral 111 are arranged in rows and columns, for example. As the magnetic tunnel junction 111 incorporated in the circuit shown in FIG. 14, the magnetic tunnel junction that increases the sensitivity of the magnetization state change due to the circularly polarized signal shown in the previous embodiment is applied.

In the circuit of FIG. 14, the memory cells 153 belonging to the same column have one terminal connected to the same bit line 132 and the other terminal connected to the same bit line 142. The gate electrodes (word lines) 139 of the select transistors Tr of the memory cells 153 belonging to the same row are connected together and further connected to the row decoder 151.

The bit line 132 is connected to the current source/sink circuit 155 via the switch circuit 154 such as a transistor. Also, the bit line 142 is connected to a current source/sink circuit 157 via the switch circuit 156 such as a transistor. Current source/sink circuits 155, 157 can supply or be supplied write currents to and from the connected bit lines 132, 142.

The bit line 142 is also connected to the readout circuit 152. The read circuit 152 may be connected to the bit line 132. The read circuit 152 includes a read current circuit, a sense amplifier, and the like.

At the time of writing, the switch circuits 154 and 156 and the select transistor Tr connected to the memory cell to be written are turned on to form a current path through the target memory cell. One of the current source/sink circuits 155 and 157 functions as a current source and the other functions as a current sink according to the information to be written. As a result, a write current flows in a direction corresponding to information to be written.

As for the writing speed, it is possible to perform cell selection by spin injection with a current having a pulse width of several nanoseconds to several microseconds in synchronization with the circularly polarized light signal, and perform current-assisted circularly polarized signal writing. At that time, instead of spin injection, a decrease in magnetic anisotropy due to current Joule heat generation or a spin orbit torque effect may be used. Reduction of magnetic anisotropy due to voltage effects by sourcing and sinking voltage signals rather than sourcing and sinking current can also be used.

In reading, a small read current that does not cause magnetization reversal is supplied to the designated MR element (magnetoresistive element) by the read current circuit in the same manner as writing. Then, the read circuit 152 determines the resistance state by comparing the current value or voltage value resulting from the resistance value corresponding to the magnetization state of the MR element (magnetoresistive element) with a reference value.

By applying a memory having the circuit shown in FIG. 14, a signal corresponding to the helicity of the irradiated circularly polarized light can be transferred at high speed to the magnetic state of the cell selected by current or voltage and stored. In addition, a magnetic memory interface capable of reading stored information can be provided as an advantageous effect.

Figure 15A:
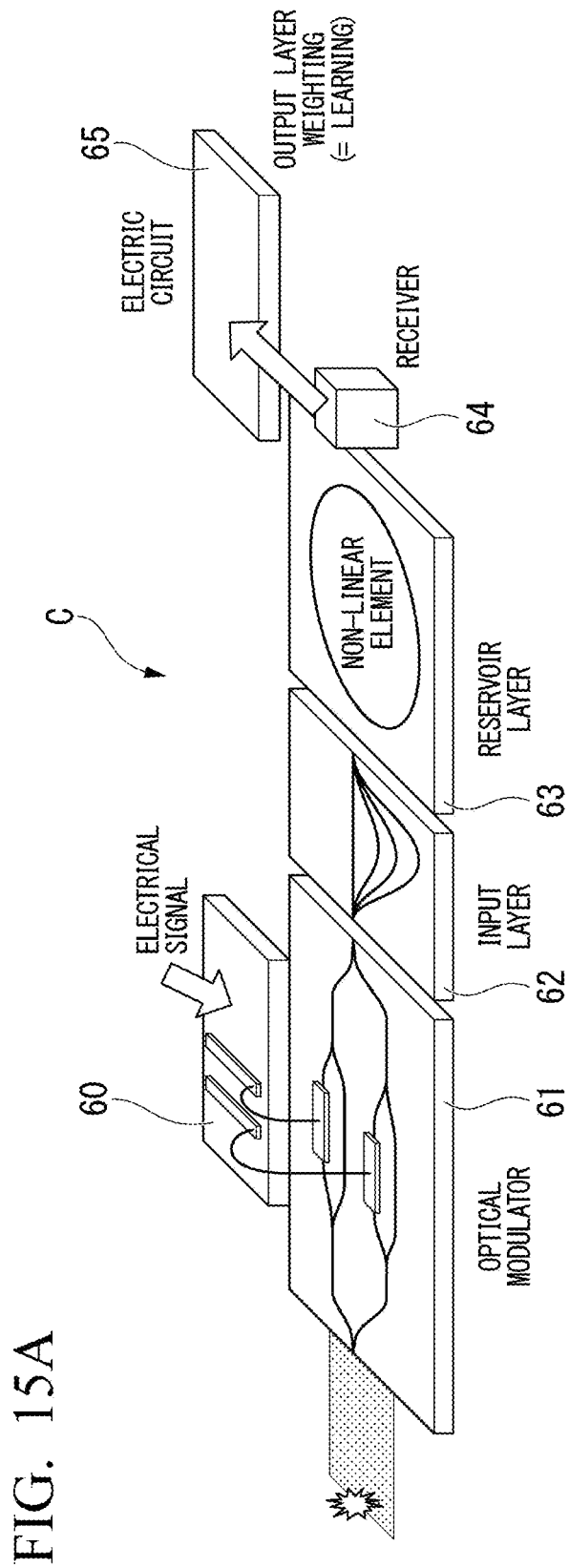
FIG. 15A is an explanatory diagram showing an example of an optical reservoir computer incorporating the first embodiment of the magneto-optical memory interface shown in FIG. 1.

FIG. 15A shows an example of an optical reservoir computing system C to which the magneto-optical memory interface A configured as shown in FIGS. 1 and 2 can be applied. This optical reservoir computing system C is a device that mimics part of the functions of the biological brain.

For example, research is being conducted on technology for recognizing objects through deep learning using a deep neural network with a multi-layered structure. In a neural network, at each node (corresponding to a nerve cell), a signal input to that node is weighted, output through an appropriate nonlinear function, and propagated to the next node. Changing this weighting to an appropriate signal for the input signal corresponds to learning.

The reservoir computing system learns by changing the weighting only in the output layer without changing the weighting in the intermediate layer. An optical reservoir computing system C shown in FIG. 15A performs arithmetic processing at high speed and low power consumption, which exceeds that of electronic circuits by implementing this reservoir computing with an optical circuit.

The optical reservoir computing system C includes the optical signal input means 60, the optical modulator 61, the optical input layer 62, the reservoir layer 63, the receiver 64 and the output layer 65.

The modulated light from the optical signal input means 60 is multiplexed with the light input to the optical path provided in the optical modulator 61, and the input layer 62 having an optical filter function realizes ultra-high speed and low power consumption that are difficult with electronic circuits. Subsequently, in the reservoir layer 63, various signal generation is realized by a simple optical loop circuit containing a nonlinear element. Information can be recorded and stored by inputting the resulting optical signal from the receiver 64 to the electric circuit 65 as an electric signal and recording it.

Figure 15B:
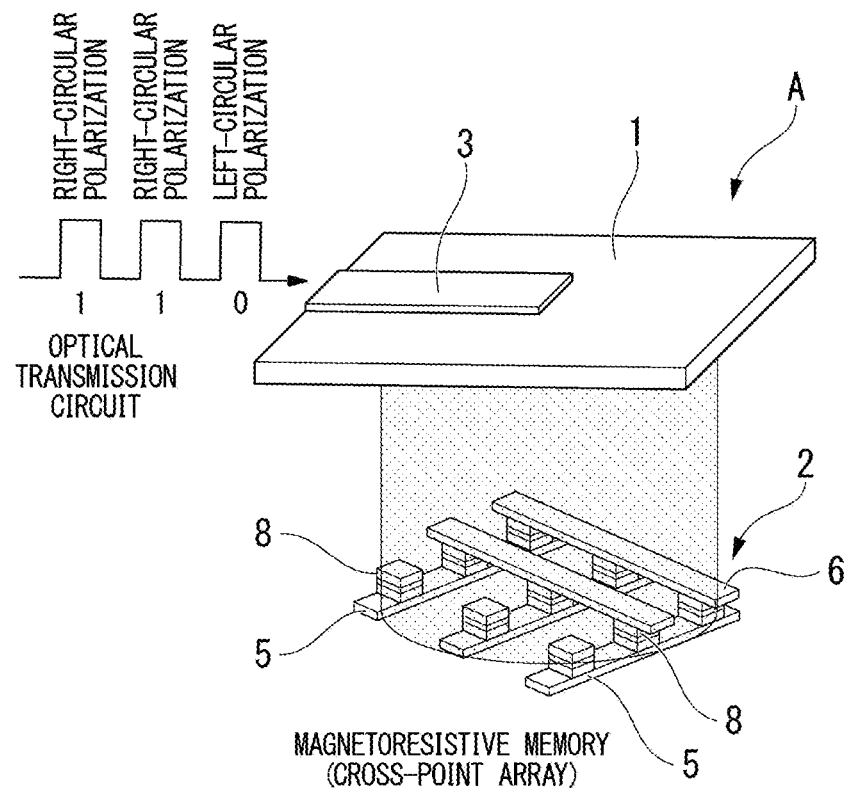
FIG. 15B is an explanatory diagram showing an example of a magneto-optical memory interface applied to the optical reservoir computer shown in FIG. 15A.

In the optical reservoir computing system C, the optical signal received by the receiver 64 is converted into an electrical signal, sent to the output layer 65, which is an electrical circuit, and weighted and learned. A magneto-optical memory interface A shown in FIG. 15B having the same structure as that shown in FIGS. 1 and 2 can be applied to the receiver 64 and the output layer 65.

By applying the magneto-optical memory interface A to the optical reservoir computing system C, the performance of the effect of being able to memorize part of the brain function learning and its results can be greatly accelerated. Therefore, it can be applied to a high-speed brain information processing interface.

Figure 16:
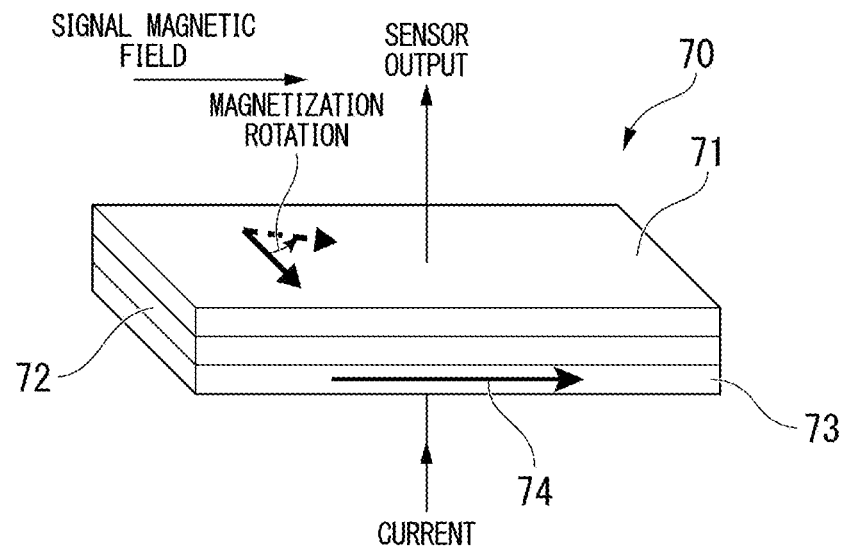
FIG. 16 is an explanatory diagram showing an example of a sensor for detecting a leakage magnetic field of a magnetic layer provided in a magnetic recording cell.

FIG. 16 is an explanatory diagram showing an example of a sensor for detecting leakage magnetic fields of magnetic bodies (free magnetic layers) provided in any of the magnetic recording cells described above.

The magnetic sensor 70 shown in FIG. 16 is a thin-film multilayer TMR (tunnel magnetoresistive effect) in which the free magnetic layer (ferromagnetic thin film) 71, the tunnel layer (insulator thin film) 72, and the pinned magnetic layer (ferromagnetic layer) 73 are laminated. The tunnel layer 72 is an ultra-thin insulating thin film having a thickness of several nanometers through which electrons can tunnel. The tunnel layer 72 is made of MgO thin film or the like, and a laminated structure in which CoFeB layers are arranged on both sides of the tunnel layer can be adopted.

The direction of the fixed magnetization in the pinned magnetic layer 73 is fixed in one direction in the film plane as indicated by reference numeral 74, whereas the direction of magnetization in the free magnetic layer 71 is influenced by the direction of the solid arrow in FIG. 16. On the other hand, when a signal magnetic field (leakage magnetic field) is applied, the magnetization direction of the free magnetic layer 71 is affected by the direction of the signal magnetic field and rotates by a predetermined angle as indicated by the chain-line arrow. When a current is passed from the pinned magnetic layer 73 to the free magnetic layer 71 side, the electric resistance value changes according to the relative angle difference between the magnetization directions, so it can be used as a magnetic sensor.

To apply the magnetic sensor 70 to the above-described magneto-optical memory interface A provided with the magnetic recording cells, for example, multiple magnetic sensors 70 are provided on the substrate so as to correspond one-to-one to magnetic recording cores arranged in a matrix. With the above configuration, each magnetic sensor 70 can read the magnetic information of each magnetic recording core.

Figure 17:
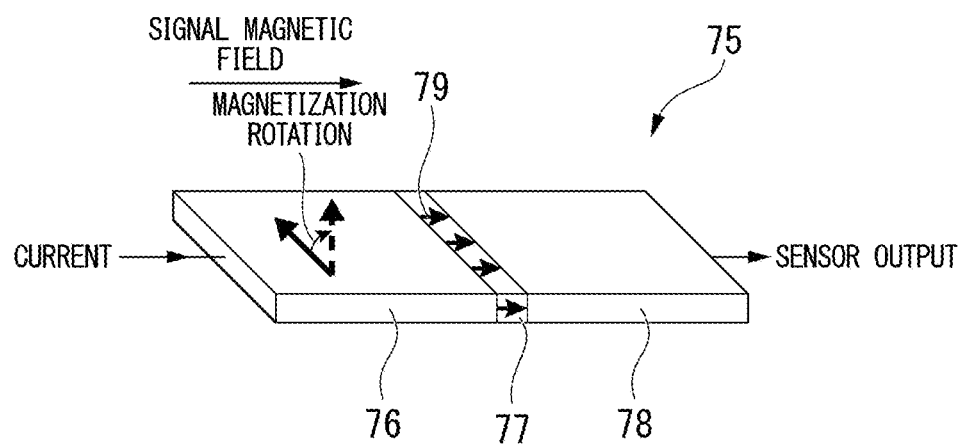
FIG. 17 is an explanatory diagram showing another example of a sensor for detecting a leakage magnetic field of a magnetic layer provided in a magnetic recording cell.

FIG. 17 is an explanatory diagram showing another example of a sensor for detecting leakage magnetic fields of magnetic bodies (free magnetic layers) provided in any of the magnetic recording cells described above.

The magnetic sensor 75 shown in FIG. 17 has a structure in which the soft magnetic yoke thin film 76, the nano-granular TMR thin film 77, and the soft magnetic yoke thin film 78 are sequentially arranged along the direction of current flow. The nano-granular TMR thin film 77 is arranged in the center gap between the rectangular soft magnetic yoke thin films 76 and 78.

The nano-granular TMR thin film 77 is, for example, a multi-layered thin film made of a magnetic metal and an insulator such as an oxide or fluoride, and has a structure in which magnetic metal fine particles with a diameter of several nanometers are isolated and dispersed in the insulator. For example, in the (CoFe)—MgF system, when the metal amount of (CoFe) is in the range of 25 to 45 at %, a large magnetoresistance ratio can be obtained.

The soft magnetic yoke thin film 76 has uniaxial magnetic anisotropy perpendicular to the direction of current flow by heat treatment in a magnetic field. When a signal magnetic field is applied from the outside parallel to the direction of current flow, the magnetization of the soft magnetic yoke thin film 76 rotates in the direction of the magnetic field, generating magnetic flux. This magnetic flux is guided to the gap portion, the magnetic field is applied to the nano-granular TMR thin film 77, and the electrical resistance of the gap portion changes. By reading this electrical resistance change, the magnetic sensor 75 functions as a sensor.

To apply the magnetic sensor 75 to the above-described magneto-optical memory interface A provided with the magnetic recording cells, for example, multiple magnetic sensors 75 are provided on the substrate so as to correspond one-to-one to magnetic recording cores arranged in a matrix. With the above configuration, each magnetic sensor 75 can read the magnetic information of each magnetic recording core.

The leakage magnetic field reading sensor applicable to the magneto-optical memory interface A of this embodiment is not limited to the structure shown in FIGS. 16 and 17. Any known magnetic sensor may be used as long as it can detect leakage magnetic fields.

BRIEF DESCRIPTION OF THE REFERENCE SYMBOLS

A: Magneto-optical memory interface, 1: Light irradiation part, 2: Memory cell structure, 3: Optical transmission line, 5: Reference side selection signal line, 6: Opposite side selection signal line, 8: Magnetic recording cell, 9: Cell selection element, 10: Magnetic tunnel junction, 11: Optical spin conversion layer, 12: Fixed magnetic layer, 13: Free magnetic layer, 15: Intermediate layer, 17: Substrate, 18: Non-magnetic metal layer, 19: Free magnetic layer, 20: Optical spin conversion layer, 30: Barrier layer, 31: Fixed magnetic layer, 32: Free magnetic layer. 42: SAF layer (antiferromagnetic junction layer). 43: Barrier layer, 44: Free magnetic layer, 45: Free magnetic layer, 45A: Magnetic domain wall, 46, 47: Magnetic domain, 50: Antiferromagnetic layer, 51: Free magnetic layer, 52, 53: Specific magnetic domain, C: Optical reservoir computing system, 60: Optical signal input means, 61: optical modulator, 62: Optical input layer, 63: Reservoir layer, 64: Receiver, 65: Output layer, 70, 75: Magnetic sensor, 111: Magnetic tunnel junction, Tr: Transistor

What is claimed is:

1. A magneto-optical memory interface comprising:
    a memory cell structure having a plurality of magnetic recording cells allocated therein,
    a selection means configured to individually select one of the magnetic recording cells or select a predetermined number of the magnetic recording cells of the memory structure, and configured for an electronic signal to be applicable to selected magnetic recording cells; and
    a light irradiation part configured to irradiate the predetermined number of the magnetic memory cells with an optical signal, wherein
    each of the magnetic recording cells is a magnetic recording cell whose sensitivity to changes in a magnetization state thereof increases in response to an irradiation light from the light irradiation part, and
    each of the magnetic recording cells is a magnetic recording cell whose magnetization state changes due to the irradiation light from the light irradiation part and in response to an applied electrical signal resulting from selection by the selection means.

2. The magneto-optical memory interface according to claim 1, wherein
    a method for selecting the magnetic recording cells by applying the electronic signal is one of:
        reduction of magnetic anisotropy due to voltage effect using voltage signal;
        a spin-transfer-torque using current;
        spin-orbit torque; and
        thermal reduction of magnetic anisotropy using current.

3. The magneto-optical memory interface according to claim 1, wherein the changes in the magnetization state are one or more of: simultaneous rotation of magnetization; movement of a magnetic domain; and movement of a magnetic domain wall, in a magnetic layer provided to each of the magnetic recording cells.

4. The magneto-optical memory interface according to claim 2, wherein the magneto-optical memory interface further comprises a bias magnetic field applying means for improving an error rate against the changes in the magnetization state of each of the magnetic recording cells.

5. The magneto-optical memory interface according to claim 1, wherein the magnetic recording cells are arranged in a matrix in the memory cell structure.

6. The magneto-optical memory interface according to claim 1, wherein the magneto-optical memory further comprises:
   reference side selection signal lines, each of which is connected to one side of magnetic recording cells for each row aligned in a horizontal direction; and
   opposite side selection signal lines, each of which is connected to other side of magnetic recording cells for each column aligned in a longitudinal direction, wherein
any one of the magnetic recording cells of the memory cell structure is configured to be energized freely by controlling energizing of the reference side selection signal lines and the opposite side selection signal lines.

7. The magneto-optical memory interface according to claim 6, wherein among the reference side selection signal lines and the opposite side selection signal lines, a selection signal line provided to a side close to the light irradiation part is made of a transparent electrode line.

8. The magneto-optical memory interface according to claim 1, further comprising:

a reading means with a magnetoresistive element with a transistor; or a sensor for detecting a leakage magnetic field of a magnetic body provided to the magnetic recording cells.

9. The magneto-optical memory interface according to claim 1, further comprising:

a means for writing a signal corresponding to a size of a specific magnetic domain region to the magnetic layer of the selected magnetic recording cells;

a means for writing a signal corresponding to a size of a region of a specific magnetic domain corresponding to a plurality of pinning sites to the magnetic layer of the selected magnetic recording cells; or a means for writing a signal corresponding to a size of the multilevel memory to the magnetic layer of the selected magnetic recording cells.

* * * * *